United States Patent [19]

Wong et al.

[11] Patent Number: 4,655,382
[45] Date of Patent: Apr. 7, 1987

[54] MATERIALS FOR USE IN FORMING ELECTRONIC INTERCONNECT

[75] Inventors: Geoffrey B. Wong, Palo Alto; Arthur W. Lopez, Jr., Redwood City, both of Calif.

[73] Assignee: Raychem Corp., Menlo Park, Calif.

[21] Appl. No.: 797,287

[22] Filed: Nov. 12, 1985

[51] Int. Cl.$^4$ ............................................. B23K 35/14
[52] U.S. Cl. .................................. 228/56.3; 428/511; 428/913
[58] Field of Search .................... 428/913, 511, 116; 156/244.27, 243; 228/56.3; 339/17 CF

[56] References Cited

U.S. PATENT DOCUMENTS

| Re. 25,200 | 7/1962 | Robinson et al. | 156/244.27 |
|---|---|---|---|
| 3,034,922 | 5/1962 | Boc | 428/913 X |
| 3,431,166 | 3/1969 | Mizutani et al. | 162/135 |
| 3,472,365 | 10/1969 | Tiedema | 228/56.3 |
| 3,680,037 | 7/1972 | Nellis et al. | 339/DIG. 3 |
| 3,736,400 | 5/1973 | Spiegel et al. | 228/50 X |
| 3,859,125 | 1/1975 | Miller et al. | 428/116 X |
| 4,379,729 | 4/1983 | Cross | 156/246 X |

FOREIGN PATENT DOCUMENTS 133752 3/1985 European Pat. off. ............ 228/56.3

OTHER PUBLICATIONS

"Conductive Elastomeric Connector" data sheet CEC-011 by Technical Wire Product, Inc. a company residing in Cranford, N.J.; 7-1974.
Dissolve Product Brochure Bulletin No. 772 from Gilbreth Co., Cornwells Heights, PA.

*Primary Examiner*—Kenneth J. Ramsey
*Attorney, Agent, or Firm*—T. Gene Dillahunty

[57] ABSTRACT

This invention provides a device for placing elongate joint-forming preforms such as solder columns on electronic components such as chip carriers using a water soluble retaining member which positions and holds the preforms while they are attached to the electronic component. The retaining member is then dissolved in hot or cold water. The retaining member is constructed of water soluble or water dispersible paper in combination with coatings of or layers of a water soluble material such as polyethyleneoxide. The water soluble retaining member can be a laminate of alternating layers of water soluble paper and water soluble polymeric material.

10 Claims, No Drawings

MATERIALS FOR USE IN FORMING ELECTRONIC INTERCONNECT

FIELD OF THE INVENTION

This invention relates to materials, methods and articles for forming electrical interconnections between electronic components such as attaching chips or chip carriers to other similar components or to supporting substrates such as circuit boards.

BACKGROUND OF THE INVENTION

In the electronic, micro-electronics and computer industries it has been found that surface mounting of chip carrier packages and other similar components on printed circuit boards or other components will not withstand thermal cycling and other stresses to which the resulting assemblies are subjected during use. Therefore, it has become desirable to replace surface mounting by connecting one electronic component to another or to a circuit board using elongated joint-forming materials which will provide sufficient flexibility to enable the assembly to withstand thermal cycles and other stresses encountered during use. In commonly assigned U.S. patent applications Ser. Nos. 509,684 filed June 30, 1983 and 610,077 filed May 14, 1984, and in U.K. patent application No. 2,142,568, the disclosures of which are incorporated herein by reference, there are disclosed devices for providing such interconnection of electronic components using elongated joints between electronic components in an electronic assembly. These devices comprise a retaining member having apertures therein corresponding to the pre-selected points of interconnection and electrically conductive joint-forming material disposed in those apertures. The joint-forming material is an elongate member which can be attached to one electronic component or can be attached simultaneously to opposing electronic components thereby providing an elongate interconnect between the components which will withstand thermal cycles and other stresses. In a typical embodiment, the interconnect device contains columns of solder in the apertures of the retaining member. After the solder columns have been attached to one component or assembled between electronic components, it is frequently desirable to remove the retaining member. It has been recognized that it is desirable that the retaining member be dissolvable so that it can be removed after the joint-forming preforms, such as the solder columns, have been soldered into place on the electronic component.

It is an object of this invention to provide an improved retaining member which is dissolvable or removable in water. It is a further object of this invention to provide a retaining member which will provide sufficient strength and stability to provide for accurate placement of the joint-forming preforms, which will withstand soldering temperatures, and which is removable with water in a relatively short period of time.

SUMMARY OF THE INVENTION

This invention provides in one aspect a structure suitable for holding electrical joint-forming preforms comprising:

a layer of paper which is water soluble or water dispersible and a coating on at least one side of said paper comprising a water soluble polymer, wherein the paper and coating have sufficient dimensional and structural stability whereby the joint-forming preforms can be accurately placed on an electronic component and accurately held in position during attachment of the preforms to the electronic component.

In another aspect, this invention provides a laminate structure suitable for holding electrical joint-forming preforms comprising:

at least first and second layers of water soluble or water dispersible paper; and a water soluble material which is disposed between said layers of paper and which provides adhesion of said layers of paper to one another and wherein the layers of paper and water soluble material provide sufficient dimensional and structural stability whereby the joint-forming preforms can be accurately placed on an electronic component and accurately held in position during attachment of the preforms to the electronic component.

This laminate structure can comprise any number of layers of paper alternating with the water soluble material to provide a desired thickness of the laminate structure. The outside layer of the laminate structure can be the paper or can be the water soluble material on either or both sides.

In another aspect, this invention provides a device for connecting electrically conductive components comprising:

a retaining member having a plurality of apertures therein spaced to correspond to preselected points on an electrically conductive component; and preforms of electrically conductive joint-forming material disposed in or supported by the apertures;

wherein the retaining member comprises at least one layer of water soluble or water dispersible paper coated on at least one side thereof with a water soluble material where the retaining member has sufficient dimensional and structural stability whereby the joint-forming preforms can be accurately placed on an electronic component and accurately held in position during attachment of the preforms to the electronic component.

In this device the retaining member may alternatively comprise at least first and second layers of water soluble or water dispersible paper and a water soluble material which is disposed between said layers of paper and which provides adhesion of said layers of paper to one another and wherein the layers of paper and water soluble material provide sufficient dimensional and structure stability whereby the joint-forming preform can be accurately placed on an electronic component and accurate held in position during attachment of the preforms to the electronic component.

In another aspect, this invention provides a method for providing electrically conductive components with elongate interconnect means suitable for connection with other electrically conductive components comprising (a) positioning an electrically conductive component and an interconnect device in appropriate contact, wherein the interconnect device comprises:

a retaining member having a plurality of apertures therein spaced to correspond to preselected points on the electrically conductive component; and elongate preforms of electrically conductive joint-forming material disposed in or supported by the apertures;

wherein the retaining member comprises at least one layer of water soluble or water dispersible paper coated on at least one side thereof with a water soluble material where the retaining member has sufficient dimensional and structural stability whereby the elongate joint-forming preforms can be accurately placed on an electronic component and accurately held in position during attachment of the elongate preforms to the electronic component; and (b) causing the elongate preforms to attach to the electrically conductive component.

This method can also employ the device wherein the retaining member comprises the laminate structure of paper and water soluble material as described above.

In another aspect this invention provides a method of forming a laminate structure suitable for holding electrical joint-forming preforms comprising:

forming an extruded sheet of water soluble polymer;

layering alternating sheets of the water soluble polymer with sheets of water soluble or water dispersible paper;

applying sufficient heat and pressure for sufficient time to cause the sheets to adhere to one another.

DESCRIPTION OF THE INVENTION

The coated paper or paper laminate useful in the present invention can be made from various combinations of conventional water soluble or water dispersible papers and layers of or coatings of water soluble materials such as water soluble polymers which are known in the art. The resulting coated paper or paper laminate must have sufficient dimensional and structural stability to hold the electrical joint-forming preforms in the desired precision configuration for placement on and connection to the electronic component. The coated paper or paper laminate thus should have sufficient stiffness to hold preforms such as solder columns in appropriate vertical alignment and should be rigid enough to hold those preforms in precise lateral dimensions to correspond to the connecting pads on the electronic components. However, the coated paper or paper laminate holding the preforms should also have enough flexibility to conform to electronic components which are not perfectly flat. The coated paper or paper laminate retaining member of this invention must also be able to withstand soldering temperatures or other conditions used to attach the preforms to the electronic components and be able to withstand those temperatures for sufficient amounts of time without significant deterioration or detrimental change in the properties of the retaining member.

The water soluble or water dispersible paper useful in this invention may be selected from those known in the art, such as those described in U.S. Pat. Nos. 3,034,922 and 3,431,166 and referred to in U.S. Pat. No. 3,859,125, the disclosures of which are incorporated herein by reference. The paper should be easily dispersible in water and is preferably a paper which is quickly swellable upon contact with water. When the paper is swellable, it is usually more quickly dissolvable and dispersible. It is believed to be generally preferable to use papers made from short fibers because the short fibers are more easily removable from the electronic component after the elongated preforms have been attached to the component. When longer fibers are present in the papers, it may in some instances be more difficult to remove all traces of the paper and clean the electronic components after the preforms have been attached. The paper should be dissolvable or dispersible in either hot or cold water. Standard thicknesses of the water soluble or water dispersible paper may be used in this invention depending on the stiffness and thickness of the retaining member desired for a particular application. For example, paper having a thickness of 0.004 inches or less can be used as can papers having greater thicknesses, for example 0.007 inches or greater depending on the properties desired for the resulting retaining member.

The water soluble material used to coat or laminate the paper can be conventional water soluble materials known in the art such as polyethyleneoxide, polyvinylalcohol, polyvinylpyrrolidone, polyethyleneglycol and other conventionally known water soluble materials. These materials are illustrated in the above referenced patents and may be selected from standard reference works such as *Water-Soluble Synthetic Polymers: Properties and Behavior*, Philip Molyneux (CRC Press, Vols. 1 and 2, 1984). The water soluble material used to coat the paper or form the paper laminate according to this invention should be able to withstand the soldering temperature or other conditions used to attach the preforms to the electronic component without changing solubility characteristics. In addition, the material should not substantially melt or lose its structural integrity under those soldering or other conditions. However, it will be recognized that the water soluble material used as the coating or used to form the laminates may not be suitable to withstand those conditions or useful by itself but in combination with the reenforcing properties of the water soluble or water dispersible paper may be satisfactory for use according to the present invention.

The coated paper or paper laminate according to the present invention may be prepared by conventional coating or laminating methods. For example, the water soluble material may be coated on the paper in liquid or molten form or may be distributed on the paper in powder form then either dried or heated and cooled to cause the water soluble material to adhere to the surface of the paper. A preferred method involves forming the water soluble material into thin sheets, for example by extrusion, then lightly pressing the thin sheet of water soluble material and the water soluble paper at sufficient temperature to cause the sheet and the paper to adhere. Laminates of the paper according to the present invention can be made in the same way by assembling layers of the water soluble paper and sheets of water soluble material to the desired number of layers and total thickness then pressing the total assembly under an appropriate pressure and temperature to form the laminate. In forming the laminate it has been observed that it is desirable to have a sufficiently thick layer of water soluble material between layers of the water soluble or water dispersible paper to enable the paper to readily disperse in water. It is believed that if the paper layers are too close together and not sufficiently separated by water soluble material, they are more difficult to disperse when the retaining member is placed in water. In this regard, it is generally desirable to use a minimum of 0.002 inches thick layer of water soluble material between layers of the water soluble or water dispersible paper. The thickness of the water soluble material may be up to 0.015 inches or even greater depending on the properties of the retaining member desired.

The total thickness of the retaining member which is formed from the coated paper or paper laminate according to this invention will depend on the height or length of the electrically joint-forming preforms which are to be placed on the electronic component by using the retaining member. As generally discussed in the above referenced U.K. patent application No. 2,142,568 it is generally desirable to have the ends of the preforms extending above the surface of the retaining member. For example, when the preforms are 0.1 inches in height the retaining member will conveniently be about 0.05 inches in thickness; where the preforms are 0.05 inches in height, the retaining member will conveniently be about 0.025 inches in thickness.

It will be recognized that fillers may be used in the water soluble material that is coated on the water soluble paper or used between the paper layers in the laminate according to the present invention. Fillers may be used to achieve the desired structural and strength properties of the retaining member or may be used to modify the performance of parts of the retaining member during the soldering or other operations used to attach the preforms to the electronic components. For example, if a water soluble material is used in sheets between the laminated layers of water soluble or water dispersible paper layers which tends to melt or liquify during soldering operations, a fibrous or particulate filler can be used in the water soluble material to prevent it from flowing excessively during the soldering operation.

The electrically joint-forming preforms useful in the devices according to this invention may be any element which forms an appropriate interconnect between electronic components. These preforms may be wires, solder columns, conductive elastomers, or other materials suitable for the assembly of electronic components. A preferred preform for many interconnect applications is a solder column wrapped with a copper tape as described in FIG. 14 of U.K. patent application No. 2,142,568.

EXAMPLE

A retaining member was made using a water dissolvable paper available from Gilbreth International Corp., Bensalem, Pa. available under the trademark DISSOLVO ™ and designation as card stock no. GC-140 which is 0.007 inches in thickness. The water soluble material used was a water soluble polyethyleneoxide available from Union Carbide under the trademark POLYOX ™ under the product designation #WSR N-80. The polyethyleneoxide powder was extruded through a sheet extruder at 240° F. into sheets 0.005 inches in thickness. The retaining member was produced by laminating three layers of the water dissolvable paper and four layers of the polyethyleneoxide sheets under conditions of light pressure (in the range of about 1–5 pounds per square foot) and moderate temperature (in the range of about 250° F.) for about 30 seconds and then cooled under the same pressure conditions. The laminate was formed between twin flat belts moving at about four feet per minute through a heating zone two feet in length and a cooling zone about two feet in length. The resulting laminate was about 0.045 inches in thickness with both surfaces being polyethyleneoxide. The laminate was then cut into approximately one inch squares with the center portion of each square cut out leaving a perimeter strip about ⅛ inch wide which was then punched to form 68 apertures in which solder columns 0.1 inches in height were placed. The solder columns are about 0.022 inches in diameter formed from a 20/80 solder core wrapped with a copper tape and coated with Sn63 solder. The resulting device is a shape similar to that shown in FIGS. 4 and 14 of U.K. Pat. No. 2,142, 568. The device was then positioned on a chip carrier and the solder column preforms were attached to the chip carrier by reflowing the solder at 215° C. for one minute. After cooling, the chip carrier was then immersed in boiling water to remove the retaining member. The retaining member dissolved or dispersed and was completely removed from the chip carrier in about 15 minutes in the boiling water leaving the chip carrier with the 68 solder column preforms attached thereto with no remaining paper or polyethyleneoxide materials remaining thereon.

What is claimed is:

1. A laiminate structure having sufficient dimensions and structural stability for holding electrical joint-forming preforms and for accurately placing the preforms on an electronic component and accurately holding the preforms in position during attachment of the preforms to the electronic component comprising:
   a layer of paper which is water soluble or water dispersible and which has a coating on at least one side of said paper comprising a water soluble polymer and which has a plurality of apertures therein for receiving and holding said preforms.

2. A structure according to claim 1 wherein the water soluble polymer is polyethyleneoxide, polyvinylalcohol, polyvinylpyrrolidone, or polyethyleneglycol.

3. A laminate structure having sufficient dimensional and structural stability for holding electrical joint-forming preforms and for accurately placing the preforms on an electronic component and accurately holding the preforms in position during attachment of the preforms to the electronic component comprising:
   at least first and second layers of water soluble or water dispersible paper; and
   a water soluble material which is disposed between said layers of paper and which provides adhesion of said layers of paper to one another and wherein the laminate of paper layers and water soluable material have a plurality of apertures therein for receiving and holding said preforms.

4. A laminate structure according to claim 3 wherein at least one outside layer is water soluble material.

5. A laminate structure according to claim 3 wherein the water soluble material is polyethyleneoxide, polyvinylalcohol, polyvinylpyrrolidone, or polyethyleneglycol.

6. A laminate structure according to claim 5 wherein at least one outside layer is water soluble material.

7. A device for connecting electrically conductive elements comprising:
   a retaining member having a plurality of apertures therein spaced to correspond to preselected points on an electrically conductive element; and
   preforms of electrically conductive joint-forming material disposed in or supported by the apertures;
   wherein the retaining member comprises at least one layer of a water soluble or water dispersible paper coated on at lest one side thereof with a water soluble material where the retaining member has sufficient dimensional and structural stability whereby the joint-forming preforms can be accurately placed on an electronic component and accurately held in position during attachment of the preforms to the electronic component.

8. A device according to claim 7 wherein the retaining member comprises:
   at least first and second layers of water soluble or water dispersible paper; and
   a water soluble material which is disposed between said layers of paper and which provides adhesion of said layers of paper to one another and wherein the layers of paper and water soluble material provide sufficient dimensional and structural stability whereby the joint-forming preforms can be accurately placed on an electronic component and accurately held in position during attachment of the preforms to the electronic component.

9. A device according to claim 8 wherein the water soluble material is polyethyleneoxide, polyvinylalchol, polyvinylpyrrolidone, or polyethyleneglycol.

10. A device according to claim 7 wherein the water soluble material is polyethyleneoxide, polyvinylalcohol, polyvinylpyrrolidone, or polyethyleneglycol.

* * * * *